(12) United States Patent
Ohkubo et al.

(10) Patent No.: US 6,707,116 B2
(45) Date of Patent: Mar. 16, 2004

(54) INTEGRATED CIRCUIT AND MANUFACTURING METHOD THEREFOR

(75) Inventors: Hiroaki Ohkubo, Tokyo (JP); Yasutaka Nakashiba, Tokyo (JP)

(73) Assignee: NEC Electronics Corporation, Kawasaki (JP)

( * ) Notice: Subject to any disclaimer, the term of this patent is extended or adjusted under 35 U.S.C. 154(b) by 35 days.

(21) Appl. No.: 10/273,161

(22) Filed: Oct. 17, 2002

(65) Prior Publication Data
US 2003/0077845 A1 Apr. 24, 2003

(30) Foreign Application Priority Data

Oct. 19, 2001 (JP) ......................................... 2001-322267

(51) Int. Cl.$^7$ ............................................. H01L 31/119

(52) U.S. Cl. ...................... 257/379; 257/350; 257/368; 257/369; 257/528; 257/531

(58) Field of Search ................................. 257/379, 368, 257/369, 531, 528, 350

(56) References Cited

U.S. PATENT DOCUMENTS

| | | | | |
|---|---|---|---|---|
| 6,407,441 B1 | * | 6/2002 | Yuan ........................... | 257/531 |
| 6,426,543 B1 | * | 7/2002 | Maeda et al. ................ | 257/531 |
| 6,437,409 B2 | * | 8/2002 | Fujii ............................ | 257/379 |
| 6,528,382 B2 | * | 3/2003 | Yamauchi et al. ........... | 438/381 |
| 6,603,172 B1 | * | 8/2003 | Segawa et al. .............. | 257/328 |

FOREIGN PATENT DOCUMENTS

JP        2000-150783        5/2000

* cited by examiner

*Primary Examiner*—John F. Niebling
*Assistant Examiner*—Remmon R. Fordé
(74) *Attorney, Agent, or Firm*—Katten Muchin Zavis Rosenman

(57) ABSTRACT

An integrated circuit is manufactured by providing a P$^-$ or P$^{--}$ type semiconductor substrate with a resistivity of 10 to 1000 Ω·cm, disposing a CMOS on top of the semiconductor substrate, depositing an insulating film with several wirings embedded therein over the CMOS, and disposing an inductor on top of the insulating film in a region that is apart from where the CMOS is positioned. A p$^+$ type diffused layer with a resistivity of about 0.01 Ω·cm is disposed between the semiconductor substrate and the CMOS.

9 Claims, 5 Drawing Sheets

INTEGRATED CIRCUIT AND MANUFACTURING METHOD THEREFOR

BACKGROUND OF THE INVENTION

1. Field of the Invention

The present invention relates to integrated circuits incorporating active devices, such as complementary metal oxide semiconductors (CMOS) and thin-film transistors (TFT), and inductors, and also to a manufacturing method for such integrated circuits. More specifically, the present invention relates to integrated circuits in which induction of eddy current is prevented to thereby improve the performance of inductors and to a manufacturing method for such integrated circuits.

2. Description of the Related Art

Conventional integrated circuits with active devices, such as CMOS, and inductors are fabricated on a standard substrate, which typically consists of a $P^+$ type bulk substrate and an epitaxial layer doped with P type impurities deposited on the bulk substrate.

FIG. 1 shows a cross-section of an integrated circuit of conventional construction. This type of integrated circuits uses a standard substrate that consists of a $P^+$ type bulk substrate 51 and a $P^-$ type epitaxial layer 52 deposited on the $P^+$ type bulk substrate 51. The $P^+$ type bulk substrate 51 has a resistivity of about 0.01 Ω·cm and is about 700 μm thick. The $P^-$ type epitaxial layer 52 has a resistivity of about 10 Ω·cm and is about 5 μm thick. A CMOS 55, an active device, is arranged in a region on the surface of the $P^-$ type epitaxial layer 52. The CMOS 55 includes a P well 53 and an N well 54. An insulating film 56 is disposed on top of the $P^-$ type epitaxial layer 52 over the region where the CMOS 55 is not arranged, and an insulating film 57 is further disposed over the insulating film 56 and the CMOS 55. An inductor 58 is arranged on a part of the region of the insulating film 57 that corresponds to the insulating film 56. In the integrated circuit as shown in FIG. 1, the use of the standard substrate consisting of the $P^+$ type bulk substrate 51 and the $P^-$ type epitaxial layer 52 helps prevent occurrences of latch-up events in the CMOS 55 and facilitates impurity gettering in the CMOS 55.

However, the integrated circuit as shown in FIG. 1, in which the $P^+$ type bulk substrate 51 has a low resistivity of about 0.01 Ω·cm, is subjected to eddy-current loss occurring within the $P^+$ type bulk substrate 51 upon operation of the inductor 58. As a result, the Q-value of the inductor 58 is reduced, and so is the performance of the inductor 58.

Although it may be effective to employ a substrate with high resistivity for the sole purpose of suppressing the eddy current, the use of such a highly resistive substrate as the substrate of integrated circuits leads to fluctuation in the substrate voltage and thus to an increased occurrence of latch-up events.

In one technique disclosed in Japanese Patent Laid-Open Publication No. 2000-150783 intended to solve the above-described problems, it is proposed to dispose within the bulk substrate a buried layer heavily doped with impurities. In this manner, the performance of the inductor can be improved without increasing the likelihood of latch-up events.

Nevertheless, the conventional technique is associated with the following problem: in the integrated circuit of the type disclosed in Japanese Patent Laid-Open Publication No. 2000-150783, eddy current is induced and flows through the poorly resistive buried layer, adversely affecting the performance of the inductor.

SUMMARY OF THE INVENTION

It is an object of the present invention to provide an improved integrated circuit with an active device, such as CMOS, and an inductor, in which occurrences of latch-up events in the active device have been decreased, have been decreased the generation of eddy current, to improve the performance of the inductor. Also, another object of the present invention is to provide a manufacturing method for manufacturing such integrated circuits.

An integrated circuit according to the present invention comprises an integrated circuit comprising: a semiconductor substrate of a first conductivity type having an active device region and an inductor region that is apart from the active device region; a semiconductor layer of the first conductivity type disposed on the semiconductor substrate, the semiconductor layer having a lower resistivity than the semiconductor substrate; an active device disposed on a surface of the semiconductor layer in the active device region; an insulating film disposed on the semiconductor layer so as to cover the active device; an inductor disposed on the insulating film in the inductor region; and a first layer of the first conductivity type locally disposed between the semiconductor layer and the semiconductor substrate in the active device region, the first layer having a lower resistivity than the semiconductor layer.

One advantage of the present invention is that occurrence of latch-up events is prevented by using a semiconductor substrate with an increased resistivity and disposing a first layer between the semiconductor substrate and the active device. This first layer has a lower resistivity than the semiconductor device. In order to prevent induction of eddy currents, the first layer is not disposed between the inductor and the semiconductor substrate. As a result, the performance of the inductor is improved while the latch-up characteristics of the integrated circuit is ensured. As used herein, the term "active device" refers to CMOS, TFT, and the like. The resistivity of the semiconductor substrate and the first layer can be controlled for example by adjusting the concentration of impurities to be implanted.

The integrated circuit in accordance with the present invention further comprises a second layer of the first conductivity type locally disposed between the semiconductor layer and the semiconductor substrate in the inductor region, the second layer having a resistivity lower than that of the semiconductor layer but higher than that of the first layer.

The second layer disposed between the inductor and the semiconductor substrate helps ensure some conductivity in the direction parallel to the surface of the semiconductor substrate while preventing induction of eddy currents. As a result, occurrence of latch-up in the active device is prevented and the performance of the inductor is improved. Also, the electrical potential becomes uniform and the current is stabilized in the substrate.

The second layer may be configured as a lattice when viewed from the direction perpendicular to the surface of the semiconductor substrate. Alternatively, the second layer may consist of a plurality of strip-shaped parts that are arranged radially or parallel to one another as viewed from the direction perpendicular to the surface of the semiconductor substrate.

One manufacturing method for an integrated circuit according to the present invention involves locally forming a first layer of a first conductivity type on a semiconductor substrate of the first conductivity type in an active device region of the semiconductor substrate, the first layer having a lower resistivity than the semiconductor substrate; depositing a semiconductor layer of the first conductivity type over the semiconductor substrate and the first layer, the semiconductor layer having a resistivity lower than that of the semiconductor substrate but higher than that of the first layer; disposing an active device on the surface of the semiconductor layer in an active device region; depositing an insulating film over the active device; and disposing an inductor on the insulating film in an inductor region that is apart from the active device region.

Another manufacturing method for an integrated circuit according to the present invention involves forming a second layer of a first conductivity type on a semiconductor substrate of the first conductivity type, the second layer having a lower resistivity than the semiconductor substrate; locally implanting impurities of the first conductivity type into an active device region of the second layer to cause a part of the second layer to become a first layer of the first conductivity type, the first layer having a lower resistivity than the second layer; depositing a semiconductor layer of the first conductivity type over the first layer and the second layer, the semiconductor layer having a resistivity lower than that of the semiconductor substrate but higher than that of the second layer; disposing an active device on the surface of the semiconductor layer in the active device region; depositing an insulating film over the active device; and disposing an inductor on the insulating film in an inductor region of the second layer that is apart from the active device region.

As described in detail, the present invention provides a novel integrated circuit including an active device, such as CMOS and TFT, and an inductor in which occurrence of latch-up events in the active device is prevented, as is induction of eddy currents, so as to improve the performance of the inductor.

DETAILED DESCRIPTION OF THE PREFERRED EMBODIMENTS

Figure 2:
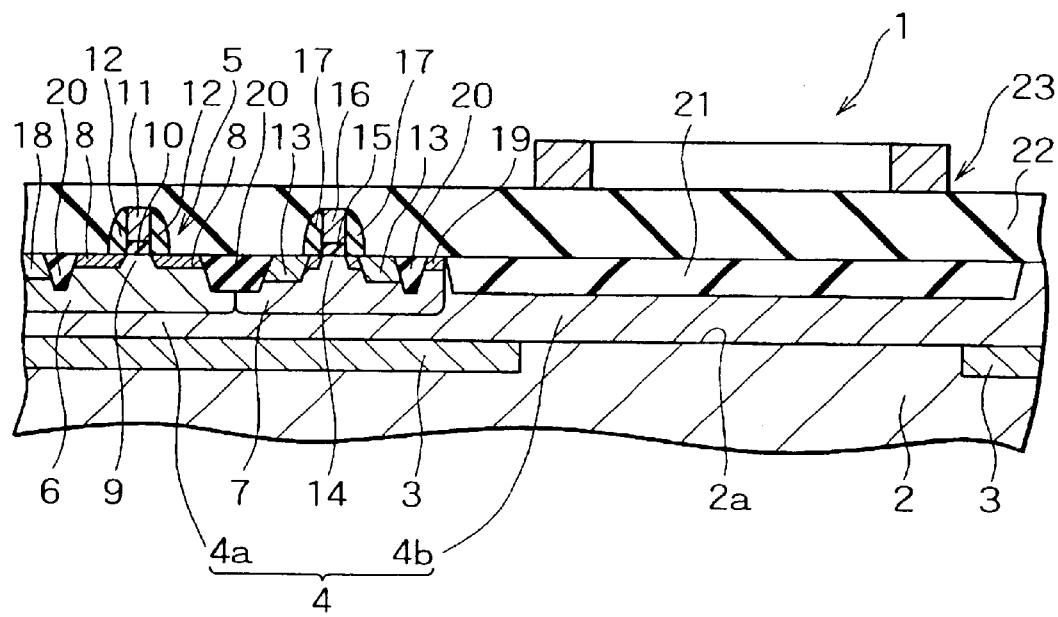
FIG. 2 is a cross-sectional view showing an integrated circuit constructed in accordance with a first embodiment of the present invention.

Embodiments of the present invention will now be described in detail with reference to the accompanying drawings. First of all, a first embodiment of the present invention is described. Referring to FIG. 2, an integrated circuit in accordance with the first embodiment of the present invention is shown in its cross-section while the same integrated circuit is shown in a plan view in FIG. 3.

As shown in FIG. 2, the integrated circuit 1 of the present embodiment includes a semiconductor substrate 2 formed of either $P^-$ or $P^{--}$ type silicon. The semiconductor substrate 2 has a thickness of, for example, about 700 $\mu$m and a resistivity of, for example, 10 to 1000 $\Omega$·cm. A $P^+$ type diffused layer 3 is formed over part of the semiconductor substrate 2. The $P^{++}$ type diffused layer 3 has a thickness of, for example, 1 to 2 $\mu$m and is doped with boron impurities. The $P^+$ type diffused layer 3 has a resistivity of 0.01 to 0.3 $\Omega$·cm, for example, about 0.01 $\Omega$·cm. A $P^-$ type epitaxial layer 4 is disposed over the semiconductor substrate 2 and the $P^+$ type diffused layer 3. Thus, the $P^-$ type epitaxial layer 4 is deposited directly on the semiconductor substrate 2 in a region 2a outside the $P^+$ type diffused layer 3. The $P^-$ type epitaxial layer 4 is, for example, about 5 $\mu$m thick and has a resistivity of, for example, about 10 $\Omega$·cm.

A P well 6 is arranged on top of the $P^-$ type epitaxial layer 4 in a region 4a corresponding to the $P^+$ type diffused layer 3. An N well 7 is arranged adjacent to the P well 6. A pair of $n^+$ source/drain electrodes 8 are arranged opposite one another on the surface of the P well 6 with a channel region 9 formed between the pair of $n^+$ source/drain electrodes 8. A gate-insulation film 10 is disposed on the channel region 9, and a gate electrode 11 is disposed on the gate-insulation film 10. A pair of side walls 12 are arranged on top of the respective $n^+$ source/drain electrodes 8 in a region adjacent to the gate-insulation film 10 and the gate electrode 11, so that the gate-insulation film 10 and the gate electrode 11 are sandwiched by the pair of side walls 12.

Similarly, a pair of $p^+$ source/drain electrodes 13 are arranged opposite one another on the surface of the N well 7 with a channel region 14 formed between the pair of $p^+$ source/drain electrodes 13. A gate-insulation film 15 is disposed on the channel region 14, and a gate electrode 16 is disposed on the gate-insulation film 15. A pair of side walls 17 are arranged on top of the respective $p^+$ source/drain electrodes 13 in a region adjacent to the gate-insulation film 15 and the gate electrode 16, so that the gate-insulation film 15 and the gate electrode 16 are sandwiched by the pair of side walls 17. Also, an electrode 18, formed as a $p^+$ type region, is arranged on a side of the P well 6 that is farther away from the N well 7, and an electrode 19, formed as an $n^+$ type region, is arranged on a side of the N well 7 that is farther away from the P well 6. Further, element-separation films 20 are disposed between the electrode 18 and the $n^+$ source/drain electrodes 8, between the $n^+$ source/drain electrodes 8 and the $p^+$ source/drain electrodes 13, and between the $p^+$ source/drain electrodes 13 and the electrode 19, respectively. The P well 6, the N well 7, the pair of $n^+$ source/drain electrodes 8, the pair of $p^+$ source/drain electrodes 13, the channel regions 9 and 14, the gate-insulation films 10 and 15, the gate electrodes 11 and 16, the pair of side walls 12, the pair of side walls 17, the electrodes 18 and 19, the element-separation films 20 and the region 4a of the $p^-$ type epitaxial layer 4 together constitute a CMOS 5. The region of the $p^-$ type epitaxial layer 4 outside the region 4a is referred to as a region 4b.

An insulating film 21 is disposed on the $p^-$ type epitaxial layer 4 over the region 4b. An additional insulating film 22 is disposed over the insulating film 21 and the CMOS 5. The insulating film 22 has a thickness of, for example, about 5 $\mu$m and has quadruple-layered wirings embedded therein (not shown). Furthermore, an inductor 23 is disposed on the insulating film 22 in a region outside the CMOS 5, that is, in a region 2a where the p⁺ type diffused layer 3 has not been deposited on the semiconductor substrate 2. The inductor 23 is made of, for example, aluminum and has a thickness of, for example, about 2 μm.

Figure 3:
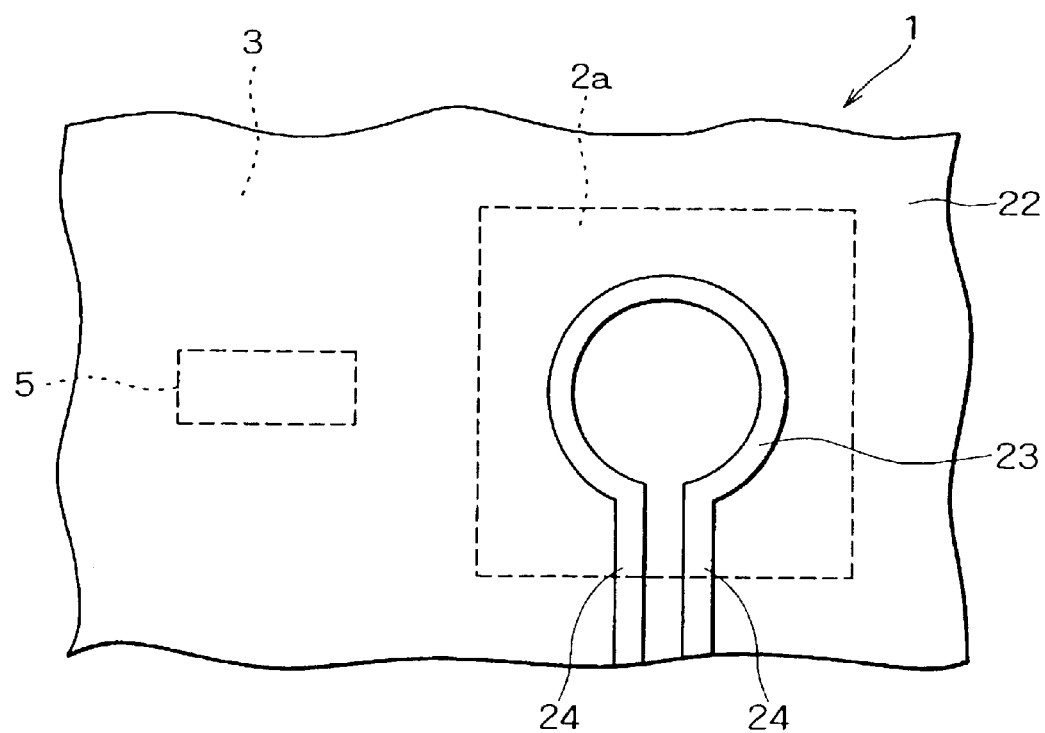
FIG. 3 is a plan view showing the integrated circuit of the first embodiment.

As shown in FIG. 3, the inductor 23 is a circular loop of a single wiring having a wire width of, for example, 10 μm. The loop has an inner diameter of, for example, 50 μm. The inductor 23 has its ends connected to a pair of terminals 24. As is also seen in FIG. 3, underneath the inductor 23 and the terminals 24 lies the insulating film 22, under which the CMOS 5 is arranged in a region apart from where the inductor 23 is arranged. The P⁺ type diffused layer 3 is disposed between the CMOS 5 and the semiconductor substrate 2 (see FIG. 2) but not between the inductor 23 and the semiconductor substrate 2, forming the region 2a of the semiconductor substrate 2.

Figure 1:
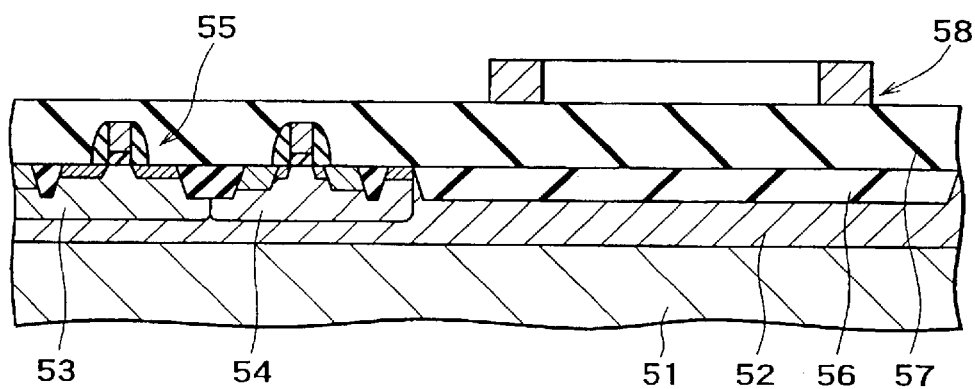
FIG. 1 is a cross-sectional view showing a conventional integrated circuit.

Since the highly electro-conductive P⁺ type diffused layer 3 with a low resistivity of about 0.01 Ω·cm is disposed immediately below the CMOS 5, the occurrence of latch-up events is prevented in the integrated circuit 1 of the present embodiment. The relatively large resistivity of the semiconductor substrate 2 of 10 to 1000 Ω·cm also helps prevent induction of eddy current within the semiconductor substrate 2 upon operation of the, inductor 23. Furthermore, the absence of the P⁺ type diffused layer 3 immediately below the inductor 23 helps prevent induction of eddy current within the P⁺ type diffused layer 3. Accordingly, the Q-value of the inductor 23 is increased, and as a result, the performance of the inductor 23 is improved. It has turned out, through a simulation of the inductor 23 of the integrated circuit 1 of the present embodiment, that the inductor 23 has the Q-value of about 4.9, which is significantly higher than the Q-value of about 3.0 of the conventional integrated circuit as shown in FIG. 1.

While a circular inductor 23 has been described in the present embodiment, the inductor 23 may be of other shapes, including square and octagon. While the inductor 23 in the present embodiment has the number of turns of 1, it may have the number of turns of 2 or more. Also, while a p type silicon substrate is used to serve as the semiconductor substrate in the present embodiment, the semiconductor substrate is not limited to the p type silicon substrate and may be n type silicon substrate or substrate made of other semiconductors.

Figure 4A:
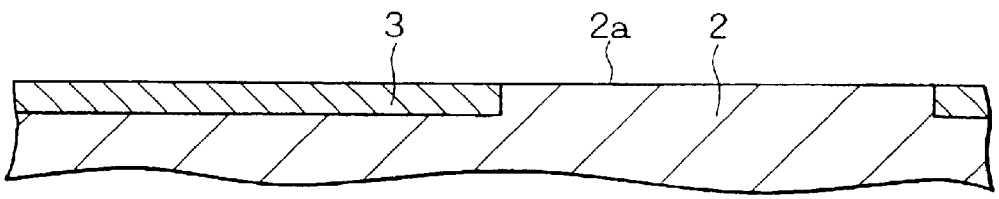
FIGS. 4A through 4D are cross-sectional views showing, in a step-by-step manner, a manufacturing method for the integrated circuit of the first embodiment.

Next, a manufacturing method for the integrated circuit 1 of the present embodiment will be described. FIGS. 4A through 4D are cross-sections depicting, in a step-by-step manner, one manufacturing method for the integrated circuit of the present embodiment. First, as shown in FIG. 4A, a semiconductor substrate 2 is provided that is for example about 700 μm thick and is made of either p⁻ or p⁻⁻ type silicon. The semiconductor substrate 2 has a resistivity of, for example, about 10 to 1000 Ω·cm. A photoresist (not shown) is then deposited on the semiconductor substrate 2 to partially cover the surface of the substrate 2. The region coated with the photoresist corresponds to the region in which the inductor 23 is placed in a later process. With the photoresist serving as a mask, boron is selectively implanted into the surface of the semiconductor substrate 2. Subsequently, the substrate 2 is annealed to diffuse the implanted boron. As a result, a p⁺ type diffused layer 3 is formed at the surface of the semiconductor substrate 2. The p⁺ type diffused layer 3 is formed to a thickness of, for example, 1 to 2 μm and have a resistivity of, for example, 0.01 to 0.3 Ω·cm, in particular 0.01 Ω·cm. Subsequently, the photoresist is removed. The region on the surface of the semiconductor substrate 2 where the p⁺ type diffused layer 3 is not formed is referred to as a region 2a.

Figure 4B:
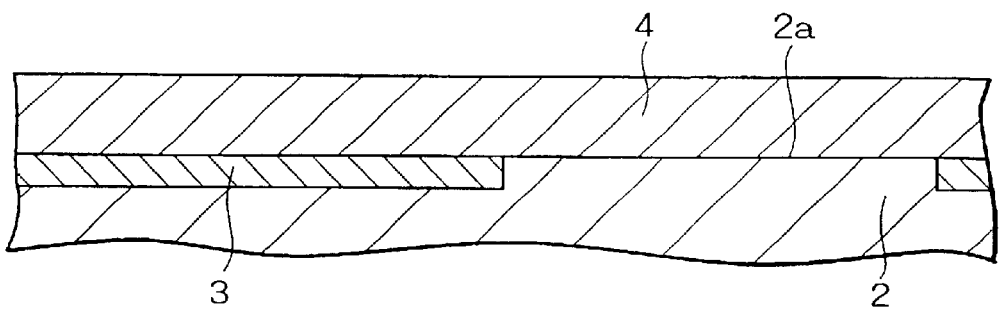

Next, as shown in FIG. 4B, a p⁻ type silicon layer is epitaxially grown on the surface of the semiconductor substrate 2 over the region 2a and the p⁺ type diffused layer 3. The p⁻ type silicon layer is grown to a thickness of, for example, about 5 μm to serve as a p⁻ type epitaxial layer 4. The p⁻ type epitaxial layer 4 is formed to have a resistivity of, for example, about 10 Ω·cm.

Figure 4C:
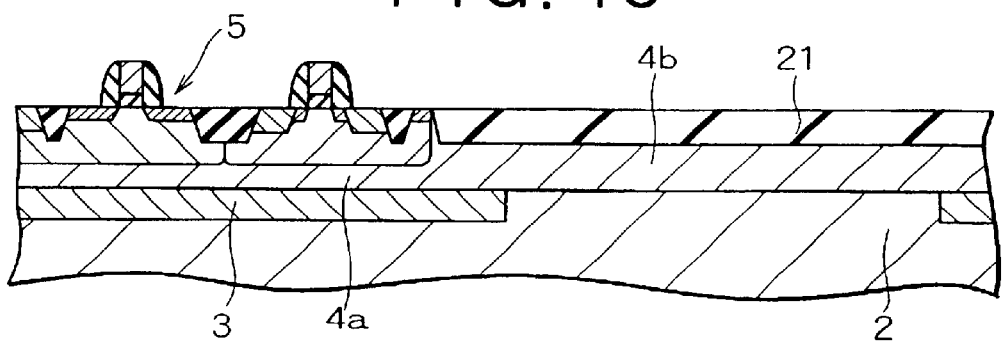

Next, as shown in FIG. 4C, a CMOS 5 is constructed using an ordinary technique in a region 4a of the p⁻ type epitaxial layer 4 immediately above the p⁺ type diffused layer 3. The CMOS 5 has the same construction as described above. An insulating film 21 is deposited on the p⁻ type epitaxial layer 4 over a region 4b where the CMOS 5 is not arranged.

Figure 4D:
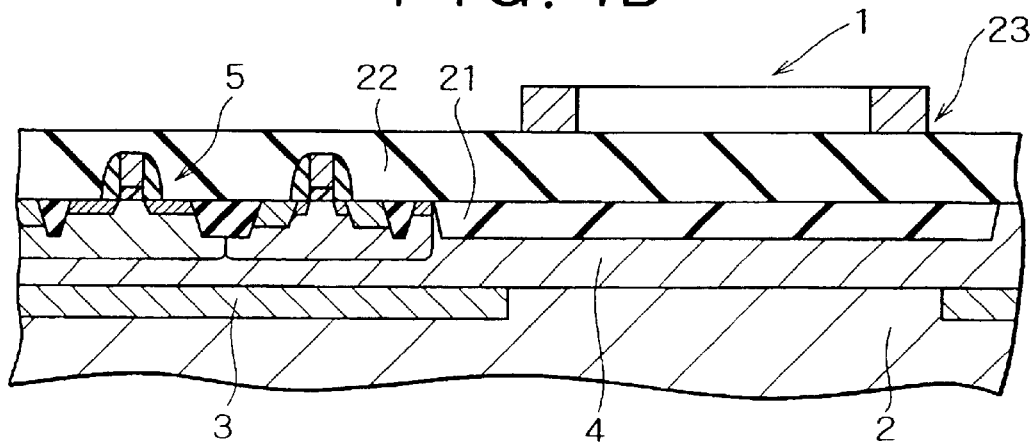

Next, as shown in FIG. 4D, an insulating film 22 is deposited over the CMOS 5 and the insulating film 21. The insulating film 22 is formed to include, for example, quadruple-layered wirings (not shown). The spaces between the wirings are filled with an insulative material. The insulating film 22 is deposited to a thickness of, for example, about 5 μm. A circular loop of a single aluminum wiring (see FIG. 3) to serve as an inductor 23 is then formed on the insulating film 22 immediately above the region 2a. The inductor 23 has its ends connected to a pair of terminals 24. The terminals 24 are each connected to wirings (not shown) embedded in the insulating film 22. This completes the integrated circuit 1 of the present embodiment.

Figure 5:
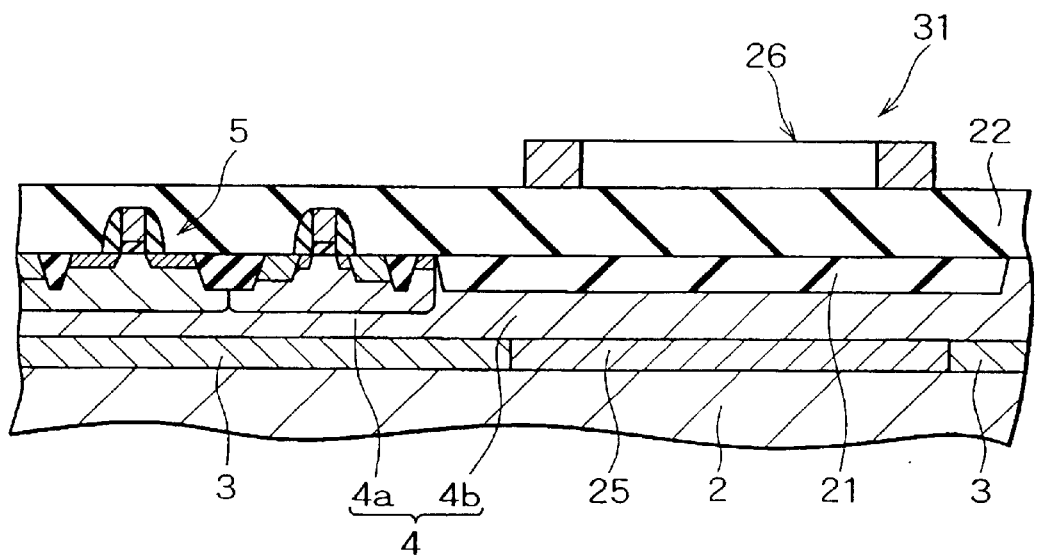
FIG. 5 is a cross-sectional view showing an integrated circuit constructed in accordance with a second embodiment of the present invention.

A second embodiment of the present invention will now be described. FIG. 5 is a cross-sectional view showing an integrated circuit in accordance with the second embodiment of the present invention. The same integrated circuit is shown in a plan view in FIG. 6. In the following description of the integrated circuit of the second embodiment, the same elements as those in the previously described integrated circuit 1 of the first embodiment are indicated by the same reference numerals and detailed description will not be repeated for these elements.

As shown in FIG. 5, the integrated circuit 31 of the present embodiment includes a semiconductor substrate 2 formed of either P⁻ or P⁻⁻ type silicon. A p⁺ type diffused layer 3 is disposed over a part of the semiconductor substrate 2. The p⁺ type diffused layer 3 has a thickness of, for example, 1 to 2 μm and is doped with boron impurities. The p⁺ type diffused layer 3 has a resistivity of, for example, about 0.01 Ω·cm. Also, a p⁺ type diffused layer 25 is deposited on top of the semiconductor substrate 2 where the p⁺ type diffused layer 3 has not been deposited. The p⁺ type diffused layer 25 has a thickness of, for example, 1 to 2 μm and is doped with boron impurities. The p⁺ type diffused layer 25 has a resistivity of, for example, about 0.1 Ω·cm. A p⁻ type epitaxial layer 4 is deposited over the p⁺ type diffused layer 3 and the p⁺ type diffused layer 25. The p⁻ type epitaxial layer 4 is, for example, about 5 μm thick and has a resistivity of, for example, about 10 Ω·cm.

A CMOS 5 is formed on top of the p⁻ type epitaxial layer 4 in the region immediately above the p⁺ type diffused layer 3. The CMOS 5 has the same construction as the previously described CMOS 5 provided in the integrated circuit 1 in the first embodiment. An insulating film 21 is deposited on the p⁻ type epitaxial layer 4 where the CMOS 5 has not been provided. An insulating film 22 is further deposited over the insulating film 21 and the CMOS 5. The insulating film 22 has the same construction as the insulating film 22 previously described in the first embodiment. Furthermore, an inductor 26 is disposed on top of the insulating film 22 in the region immediately above the p⁺ type diffused layer 25 formed on the semiconductor substrate 2. The inductor 26 is made of, for example, aluminum and has a thickness of, for example, about 2 μm.

Figure 6:
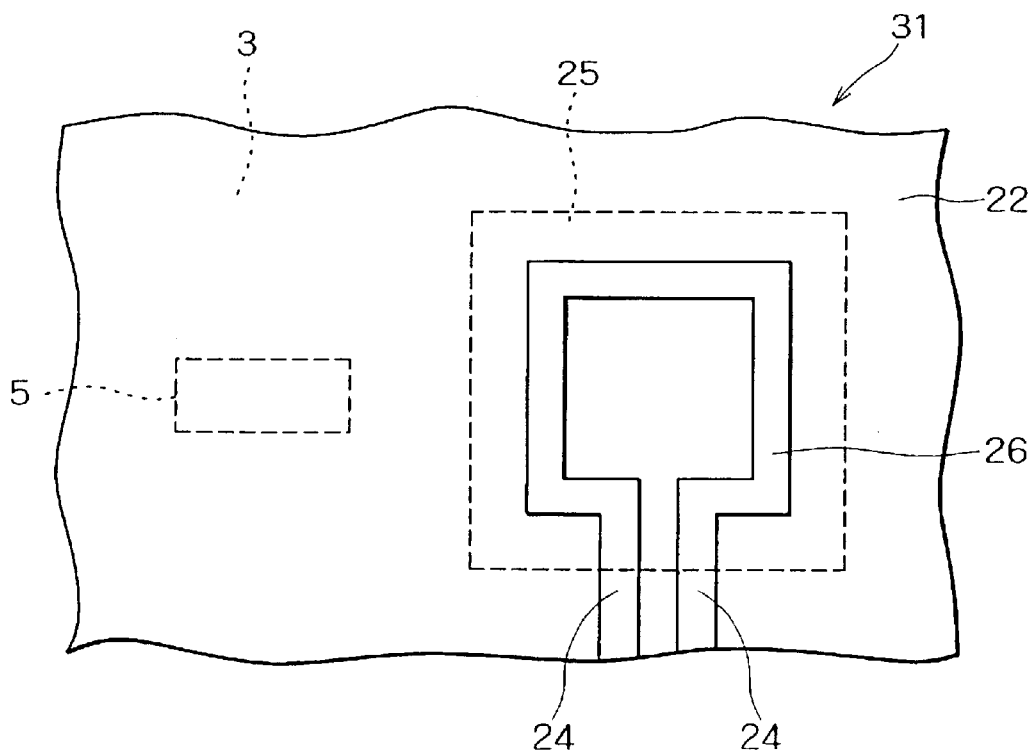
FIG. 6 is a plan view showing the integrated circuit of the second embodiment.

As shown in FIG. 6, the inductor 26 is a square-shaped loop of a single wiring, which is, for example, 10 μm wide. The inner sides of the square loop are for example about 50 μm long each. The inductor 26 has its ends connected to a pair of terminals 24. The terminals 24 are each connected to wirings (not shown) embedded in the insulating film 22. As shown in FIG. 6, underneath the inductor 26 and the terminals 24 lies the insulating film 22, under which the CMOS 5 is arranged in a region apart from where the inductor 26 is arranged. The p$^+$ type diffused layer 3 extends below the CMOS 5 but not below the inductor 23. Instead, the p$^+$ type diffused layer 25 is disposed below the inductor 23. Aside from the advantages brought about by the integrated circuit 1 of the above-described first embodiment, arrangement of the p$^+$ type diffused layer 25 immediately below the inductor 26 in the integrated circuit 31 of the present embodiment helps prevent induction of eddy current upon operation of the inductor 26 and at the same time ensures some conductivity in the horizontal direction, that is, in a direction parallel to the surface of the semiconductor substrate 2 in the region immediately below the inductor 26 since the p$^+$ type diffused layer 25 has a higher resistivity than does the p$^+$ type diffused layer 3. In this manner, the electrical potential becomes uniform and the current is stabilized in the substrate in the vicinity of the inductor 26 of the integrated circuit 31. Through a simulation of the inductor 26 of the integrated circuit 31 of the present embodiment, the Q-value of the inductor 26 has been determined to be about 4.8.

While a square-shaped inductor has been described in the present embodiment, the inductor 26 may be of other shapes, including circular shape. While the inductor 26 in the present embodiment has the number of turns of 1, it may have the number of turns of 2 or more. Also, while a p type silicon substrate is used to serve as the semiconductor substrate in the present embodiment, the semiconductor substrate is not limited to the p type silicon substrate and may be an n type silicon substrate or substrate made of other semiconductors.

Figure 7A:
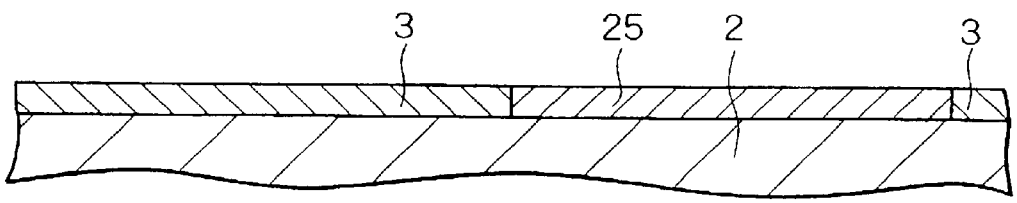
FIGS. 7A through 7D are cross-sectional views showing, in a step-by-step manner, a manufacturing method for the integrated circuit of the second embodiment.

Next, a manufacturing method for the integrated circuit 31 of the present invention will be described. FIGS. 7A through 7D are cross-sections depicting, in a step-by-step manner, one manufacturing method for the integrated circuit of the present embodiment. First, as shown in FIG. 7A, a semiconductor substrate 2 is provided that is for example about 700 μm thick and is made of either p$^-$ or p$^{--}$ type silicon. The semiconductor substrate 2 has a resistivity of, for example, about 10 to 1000 Ω·cm. A p$^{--}$ type layer is formed over the surface of the semiconductor substrate 2 through epitaxy or impurity diffusion. The p$^+$ type layer has a resistivity of, for example, about 0.1 Ω·cm. A photoresist (not shown) is then deposited on the p$^+$ type layer to partially cover the surface of the p$^+$ type layer. The region coated with the photoresist corresponds to the region in which the inductor 26 is placed in a later process. With the photoresist serving as a mask, boron is selectively implanted into the p$^+$ type layer. Subsequently, the substrate is annealed to diffuse the implanted boron. As a result, a p$^+$ type diffused layer 3 having a resistivity of for example 0.01 Ω·cm is formed over part of the semiconductor substrate 2 to a thickness of, for example, 1 to 2 μm. Subsequently, the photoresist is removed. The part of the p$^+$ type layer where no boron has been implanted serves as a p$^+$ type diffused layer 25.

Figure 7B:
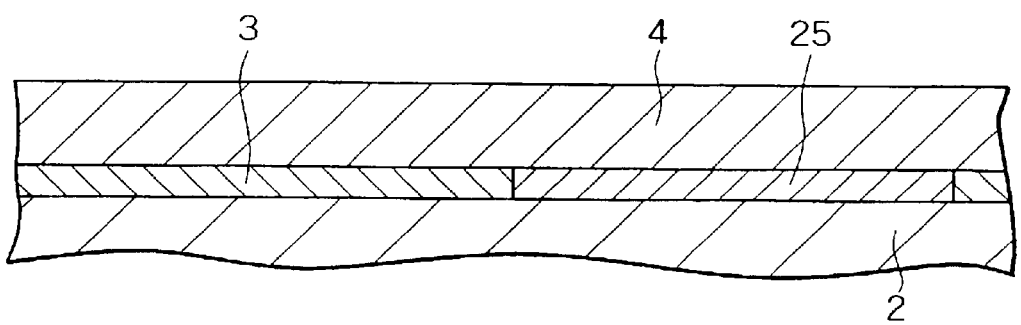

Next, as shown in FIG. 7B, a p$^-$ type silicon layer is epitaxially grown over the p$^+$ type diffused layers 3 and 25. The p$^-$ type silicon layer is grown to a thickness of, for example, about 5 μm to serve as a p$^-$ type epitaxial layer 4. The p$^-$ type epitaxial layer 4 is formed to have a resistivity of, for example, about 10 Ω·cm.

Figure 7C:
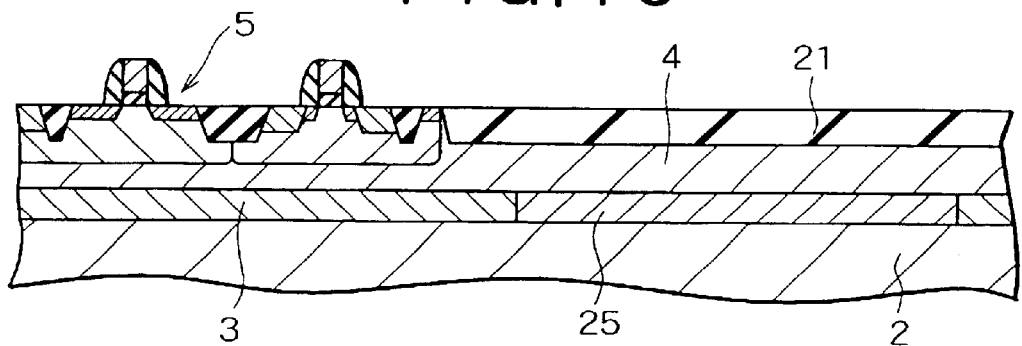
Figure 7D:
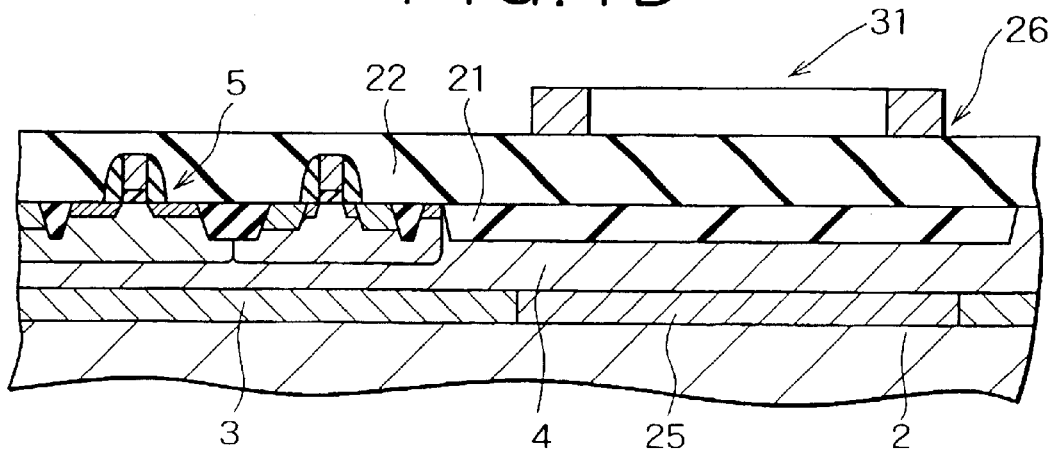

Next, as shown in FIG. 7C, a CMOS 5 is constructed using an ordinary technique in a region of the p$^-$ type epitaxial layer 4 immediately above the p$^+$ type diffused layer 3. An insulating film 21 is deposited on the p$^-$ type epitaxial layer 4 over a region outside the CMOS 5. This completes the integrated circuit 31.

What is claimed is:

1. An integrated circuit comprising:

a semiconductor substrate of a first conductivity type having an active device region and an inductor region that is apart from said active device region;

a semiconductor layer of said first conductivity type disposed on said semiconductor substrate, said semiconductor layer having a lower resistivity than said semiconductor substrate;

an active device disposed on a surface of said semiconductor layer in said active device region;

an insulating film disposed on said semiconductor layer so as to cover said active device;

an inductor disposed on said insulating film in said inductor region; and a first layer of the first conductivity type locally disposed between said semiconductor layer and said semiconductor substrate in said active device region, said first layer having a lower resistivity than said semiconductor layer.

2. The integrated circuit according to claim 1, wherein said semiconductor substrate has a resistivity of 10 Ω·cm or higher.

3. The integrated circuit according to claim 1, wherein said first layer has a resistivity of 0.3 Ω·cm or lower.

4. An integrated circuit according to claim 1, further comprising a second layer of the first conductivity type locally disposed between said semiconductor layer and said semiconductor substrate in said inductor region, said second layer having a resistivity lower than that of said semiconductor layer but higher than that of said first layer.

5. The integrated circuit according to claim 4, wherein said second layer, when viewed along the direction perpendicular to the surface of said semiconductor substrate, is configured as a lattice.

6. The integrated circuit according to claim 4, wherein said second layer consists of a plurality of strip-shaped parts that are radially arranged when viewed along the direction perpendicular to the surface of said semiconductor substrate.

7. The integrated circuit according to claim 4, wherein said second layer consists of a plurality of strip-shaped parts that are arranged parallel to one another when viewed along the direction perpendicular to the surface of said semiconductor substrate.

8. The integrated circuit according to claim 4, wherein said semiconductor substrate has a resistivity of 10 Ω·cm or higher.

9. The integrated circuit according to claim 4, wherein said first layer has a resistivity of 0.3 Ω·cm or lower.

* * * * *